(12) United States Patent
Kihara

(10) Patent No.: US 11,930,712 B2
(45) Date of Patent: Mar. 12, 2024

(54) ARRANGEMENT STRUCTURE OF PRESS SENSOR AND ELECTRONIC DEVICE

(71) Applicant: Murata Manufacturing Co., Ltd., Nagaokakyo (JP)

(72) Inventor: Takashi Kihara, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 918 days.

(21) Appl. No.: 16/922,342

(22) Filed: Jul. 7, 2020

(65) Prior Publication Data

US 2020/0335688 A1 Oct. 22, 2020

Related U.S. Application Data

(63) Continuation of application No. PCT/JP2019/044798, filed on Nov. 15, 2019.

(30) Foreign Application Priority Data

Mar. 29, 2019 (JP) ................... 2019-065235

(51) Int. Cl.
*H10N 30/30* (2023.01)
*G01N 3/24* (2006.01)
*H10N 30/88* (2023.01)

(52) U.S. Cl.
CPC ............. *H10N 30/302* (2023.02); *G01N 3/24* (2013.01); *H10N 30/88* (2023.02)

(58) Field of Classification Search
CPC ......... G01L 1/16; G01L 5/0038; H10N 30/88; H10N 30/302; H10N 30/857; G01N 3/24
See application file for complete search history.

(56) References Cited

U.S. PATENT DOCUMENTS

2019/0145838 A1    5/2019   Kihara et al.
2020/0159359 A1*   5/2020   Kawabata ............. G06F 1/1643

FOREIGN PATENT DOCUMENTS

| JP | 2011090948 A | 5/2011 |
| JP | 2018207092 A | 12/2018 |
| KR | 1020060020962 A | 3/2006 |
| WO | 2018025617 A1 | 2/2018 |
| WO | WO-2019017493 A1 * | 1/2019 ............... G01L 5/00 |

OTHER PUBLICATIONS

Tajitsu, Yoshiro. "Poly (lactic acid) for Sensing Applications." Industrial Applications of Poly (lactic acid) (2018): 159-176. (Year: 2018).*
International Search Report issued for PCT/JP2019/044798, dated Feb. 4, 2020.

* cited by examiner

*Primary Examiner* — Eric S. McCall
*Assistant Examiner* — Timothy P Graves
(74) *Attorney, Agent, or Firm* — ArentFox Schiff LLP

(57) ABSTRACT

A housing includes a side wall that includes a button region that receives a pressing operation and a bottom wall that cooperates with the side wall to define a cavity. The bottom wall has first and second regions in which the first region is more easily displaced in response to the pressing operation than the second region. A press sensor is disposed on the bottom wall in the cavity and extends across portions of the first and second regions. A slit is located in the bottom wall between the side wall and the second region and causes the first region to be more easily displaced in response to the pressing operation than the second region.

20 Claims, 9 Drawing Sheets

ARRANGEMENT STRUCTURE OF PRESS SENSOR AND ELECTRONIC DEVICE

CROSS REFERENCE TO RELATED APPLICATIONS

The present application is a continuation of International application No. PCT/JP2019/044798, filed Nov. 15, 2019, which claims priority to Japanese Patent Application No. 2019-065235, filed Mar. 29, 2019, the entire contents of each of which are incorporated herein by reference.

TECHNICAL FIELD

The present invention relates to an arrangement structure of a press sensor and an electronic device including the arrangement structure of the press sensor.

BACKGROUND ART

Japanese Patent Application Laid-Open No. 2018-207092 (Patent Document 1) discloses a sensor used for a bathtub-type housing. The sensor detects deformation of the housing in a case where a specific region on a side wall of the housing receives a pressing operation.

FIG. 9 is a diagram for describing the structure of a press sensor according to Patent Document 1 in which the press sensor is disposed on a side wall of a housing. When the side wall of the housing is thin, the sensor must be small and an output of the sensor may be low. Further, since the area of the sensor which can be adhered to the housing is small, the adhesiveness of the sensor to the housing may be reduced.

BRIEF SUMMARY OF THE INVENTION

An object of the present invention is to provide press sensor which, when adhered to a housing with a thin side wall, can detect deformation of the housing when the side wall receives pressing operation.

In accordance with an aspect of the invention, a housing includes a side wall that receives a pressing operation and a bottom wall having first and second regions, the first region being more easily displaced in response to the pressing operation than the second region. A press sensor is disposed on the bottom wall and extends across portions of the first and second regions. In a preferred embodiment, a slit is located in the bottom wall between the side wall and the second region and causes the first region to be more easily displaced in response to the pressing operation than the second region.

The slit may be located between the first and second regions and divide the bottom wall into the first and second regions. In a preferred embodiment, the slit includes first and second segments located on opposite sides of the press sensor, the first segment being located between the press sensor and the side wall.

In some embodiments, the bottom wall also includes a third region such that the first region is sandwiched by the second and third regions. The first region is more easily displaced in response to the pressing operation than the third region.

In accordance with another aspect of the invention, the slit is also located between the side wall and the third region.

In some embodiments, the combination further includes a second press sensor disposed on the bottom wall so as to extend across the first and third regions.

In some embodiments, a filler fills the slit and is made of a material that is softer than a portion of the housing that is located between the side wall and the second region.

In some embodiments, the slit has a first segment located between the side wall and the second region, and a second segment located between the first and second regions, and the combination further comprising a filler which fills the slit, the filler being made of a material that is softer than a portion of the housing that is located between the side wall and the second region.

The slit may have first, second, third, fourth and fifth segments, the first segment being located between the side wall and the second region, the second segment extending from the first segment and across the first press sensor to define a boundary point between the first and second regions, the fourth segment extending across the second press sensor to define a boundary point between the first and third regions, the fifth segment extending from the fourth segment and between the side wall and the second press sensor, and the third segment connecting the second and fourth segments.

In a preferred embodiment, the press sensor includes a piezoelectric film that detects shear distortion and the piezoelectric film contains polylactic acid. The polylactic acid is preferably stretched in a direction parallel to or orthogonal to a boundary line between the side wall and the bottom wall.

The slit can define a first the boundary line between the first and second regions and divide the first press sensor into first and second parts. When two press sensors are used, the slit can also define a second boundary line between the first and third regions, the second boundary line dividing the second press sensor into first and second parts. In an aspect of the invention, the slit causes sheer distortion to occur in the first and second press sensors in response to the pressing operation.

In another aspect of the invention, the bottom wall also includes a third region with the first region being sandwiched by the second and third regions. The first region is more easily displaced in response to the pressing operation than the third region. A single press sensor extends over at least a portion of the each of the first, second and third regions. In this embodiment, it is preferred that first and second slits be located in the bottom wall between the side wall and the second and third regions, respectively, the first and second slits causing the first region to be more easily displaced in response to the pressing operation than the second and third regions. In another aspect of the invention, a third slit is located on the opposite side of the press sensor relative to the first and second slits and in an area corresponding to the first region.

In some embodiments, the press sensor is a strain gauge and a slit is located in the bottom wall between the side wall and the second region and causes the first region to be more easily displaced in response to the pressing operation than the second region.

The invention also encompasses an electronic device using the inventions described above.

According to the present invention, in an electronic device having a housing, in a case where a side wall of the housing formed to be thin receives pressing operation, deformation of the housing by the pressing operation can be detected.

BRIEF EXPLANATION OF DRAWINGS

The drawings illustrate exemplary preferred embodiments of the invention, but the invention is not limited to these embodiments.

DESCRIPTION OF THE PREFERRED EMBODIMENTS

Figure 1:
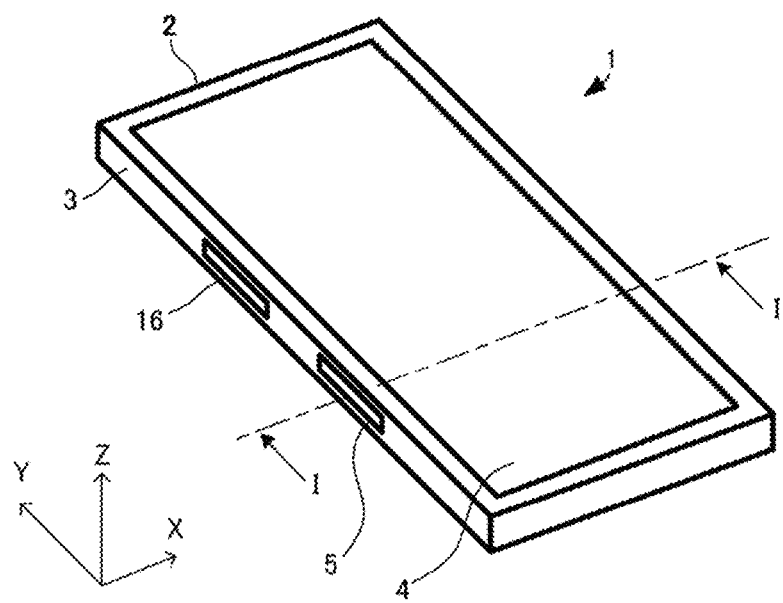
FIG. 1(A) is a perspective view of an electronic device 1 according to a first embodiment of the invention.
FIG. 1(B) is a cross-sectional view of the electronic device 1 taken along line I-I shown in FIG. 1(A).
FIG. 1(C) is another example of a cross-sectional view of the electronic device 1 taken along line I-I shown in FIG. 1(A).
Figure 1B:
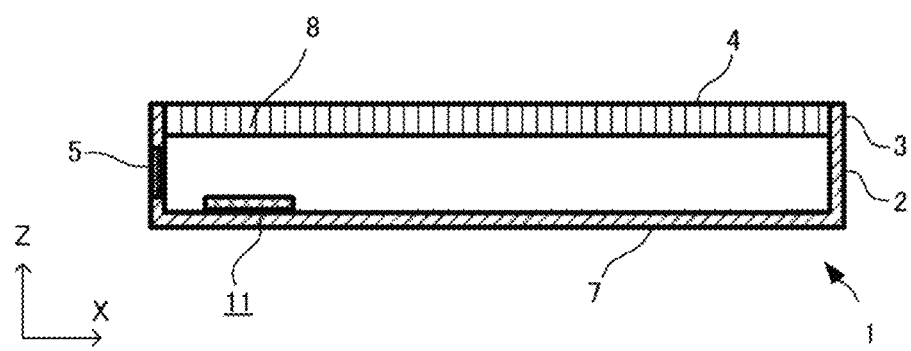
Figure 2:
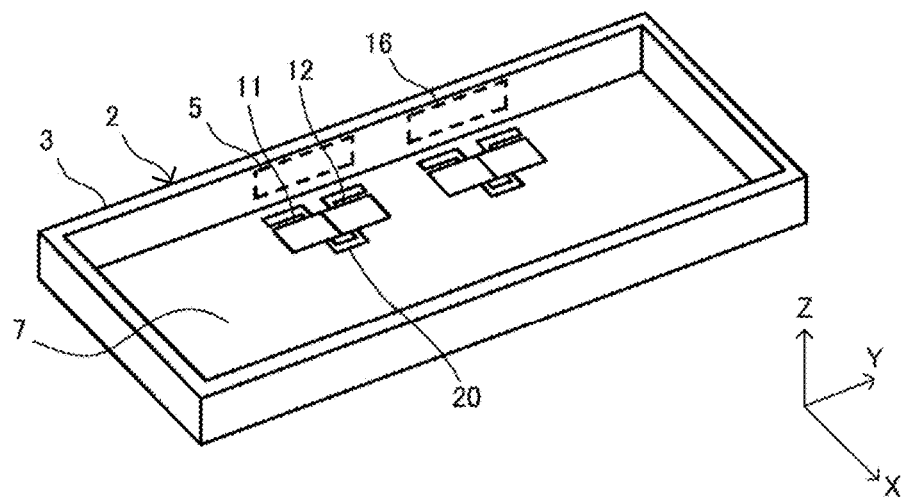
FIG. 2(A) is a diagram for describing how a press sensor according to the first embodiment can be arranged within the housing.
FIG. 2(B) is a partially enlarged plan view of FIG. 2(A) showing a slit formed in the bottom wall of the housing in the area of the press sensor.
Figure 2:
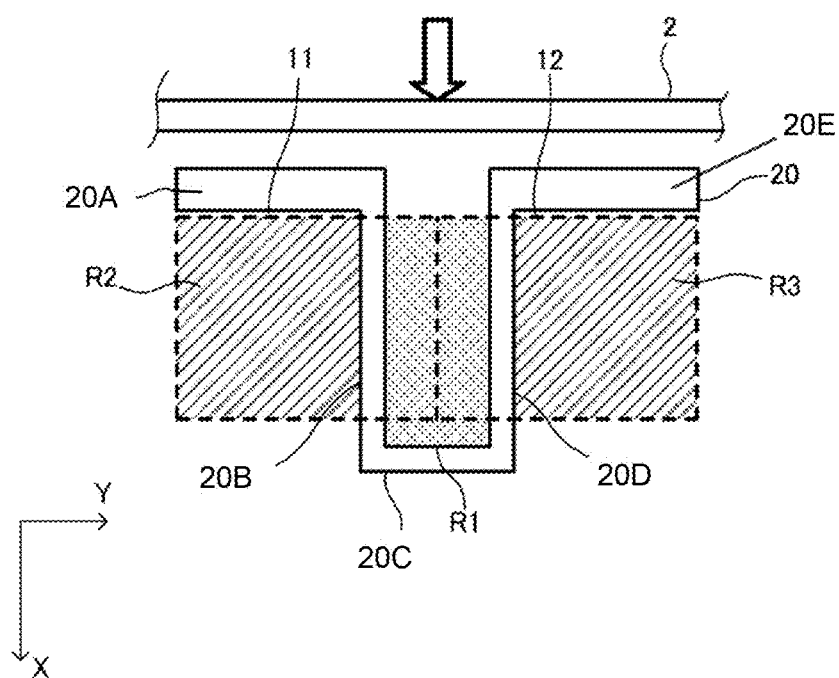

Referring now to the drawings wherein like numerals indicate like elements, FIGS. 1(A), 1(B), and 2(A), illustrate an exemplary embodiment of an electronic device 1 that includes a housing 2 having a substantially rectangular parallelepiped shape. A bottom wall 7 and a side wall 3 extending around the periphery of the bottom wall cooperate to define a cavity 8. The housing can be thought of as a bathtub-type structure having an open upper surface. Alternatively, the housing 2 may be a structure having an open lower surface instead of an open upper surface. A lid 4 having a flat shape may be placed on the upper surface of the housing 2 to enclose the cavity 8.

A reference coordinate system is shown in various figures. In this reference coordinate system, the length direction of the housing extends parallel to the Y direction (i.e., extends parallel to a boundary line between the side wall 3 and the bottom wall 7), the width direction (lateral direction) of a housing 2 extends in the X direction, and the thickness direction extends in the Z direction.

Figure 1C:
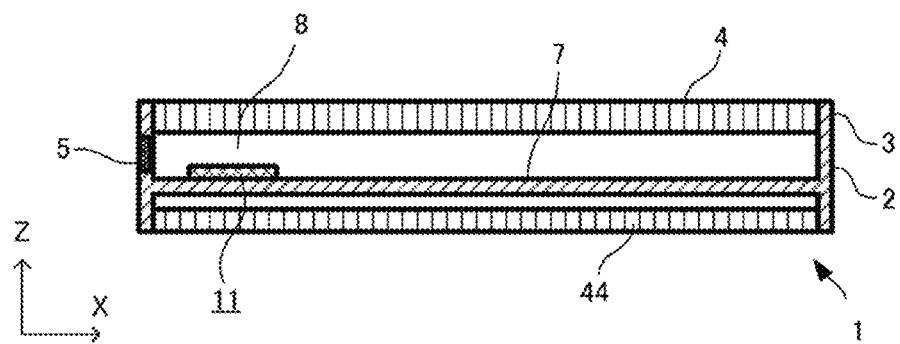

In an alternative embodiment shown in FIG. 1(C), the upper and lower surfaces of the housing 2 are open, the lid 4 is attached to the upper surface, and a second lid 44 is attached to the lower surface. In a case where the housing 2 has this shape, the bottom wall 7 is formed between the lid 4 and the lid 44.

The side wall 3 of the housing 2 has button regions 5 and 16 where a user can perform a pressing operation. The button regions 5 and 16 preferably have the same structure and only the situation where the button region 5 receives pressing operation will be described below. While two button regions are disclosed, any number of button regions can be provided.

As shown in FIG. 2(A), a pair of press sensors 11 and 12 are provided on the upper surface of the bottom wall at a location opposite the button region 5. A similar set of press sensors (unnumbered) are provided opposite the button region 16.

While the disclosed embodiment locates the press sensors on the upper surface (as viewed in FIG. 2(A)) of the bottom wall 7, they can be placed on the lower surface (i.e., exposed to the outside of the housing 2) if desired. In such a case, replacement of the press sensors is facilitated.

To enhance the ability of the sensors 11 and 12 to detect a press operation applied to the button region 5, a slit 20 is formed in the bottom wall in the area of the sensors 11 and 12. The slit preferably has a U-shape including segments 20A, 20B, 20C, 20D and 20E, as best shown in FIG. 2(B). Segments 20A and 20E are preferably located between sensors 11 and 12, respectively. Segments 20B and 20D extend away from the side wall 3 and across the press sensor 11 and 12, respectively. Segments 20B and 20D preferably extend in a direction perpendicular to the side wall and in the direction of the pressing force (shown schematically with a hollow arrow in FIG. 2(B)) applied to the button region 5. Segment 20C extends between segments 20B and 20D and parallel to the side wall 3.

As a result of this structure, and as best shown in FIG. 2(B), three regions R1, R2 and R3 are formed in the bottom wall 7. The first region R1 is located between segments 20B, 20C and 20D and encompasses adjacent portions of the press sensors 11 and 12. Region R2 is located to the left of region R1 (as viewed in FIG. 2(B), overlaps the left side region of press sensor 11. Region R3 is located to the right of Region R1 (as viewed in FIG. 2(B)) and overlaps the right hand side of press sensor 12. As a result of this structure, any pressing force applied to the button region 5 is more easily transported to the region R1 moves than the regions R2 and R3 making the sensitivity of the portions of the press sensors 11 and 12 located in the region R1 greater than the sensitivity of the portions of the press sensors 11 and 12 located in Regions R2 and R3, respectively. The effect of the slit is to allow displacement of the side wall 3 in the area of the button region 5 to be relatively easily transferred to the Region R1 but to be dampened, if not insulated, from the Regions R2 and R3.

In the preferred embodiment, a slit is used to make the first region R1 relatively easily displaced. However, other structures or materials can be used. For example, the thickness or materials of the bottom wall 7 can be varied at the locations corresponding to the first, second and/or third regions to achieve this result.

The press sensors 11 and 12 are preferably adhered to the top surface of the bottom wall 7 of the housing 2 with, for example, an adhesive tape or an adhesive. Since the press sensors 11, 12 are not directly touched, the durability of the press sensors is improved.

As further described above, the slit 20 is preferably includes segment 20C on the opposite side of the side wall 3 with respect to the first region R1 on the bottom wall 7.

When the button region 5 on the side wall 3 receives pressing operation, deformation generated on the side wall 3 is transmitted to the first region R1 on the bottom wall 7. The slit 20 exists in a direction opposite to the side wall 3 in the first region R1. For this reason, the first region R1 can be freely displaced toward the portion 23 side. Therefore, the first region R1 can be displaced greatly as compared to the case where the slit 20 is not formed in the portion 23, and in a direction opposite to the side wall 3.

The electronic device 1 preferably includes a detection unit (not shown) on an inner wall of the housing 2. The detection unit is connected to the press sensors 11 and 12, and detects a voltage generated by the press sensors 11 and 12. While the press sensors 11 and 12, and the detection unit are preferably located in the cavity 8 of the housing 2 (i.e., are located internally of the housing 2) one or more of those components may be located outside the housing 2 (e.g., on one or more external walls of the housing 2). Hereinafter, configurations of the press sensor 11 and the press sensor 12 will be described.

Figure 4:
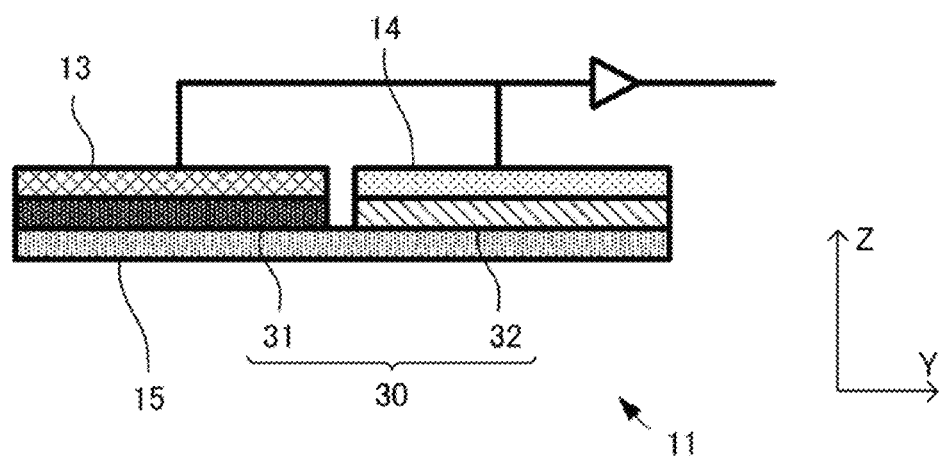
FIG. 4(A) is a cross-sectional view of the press sensor according to the first embodiment.
FIG. 4(B) is a diagram for describing a piezoelectric film according to the first embodiment.
Figure 4:
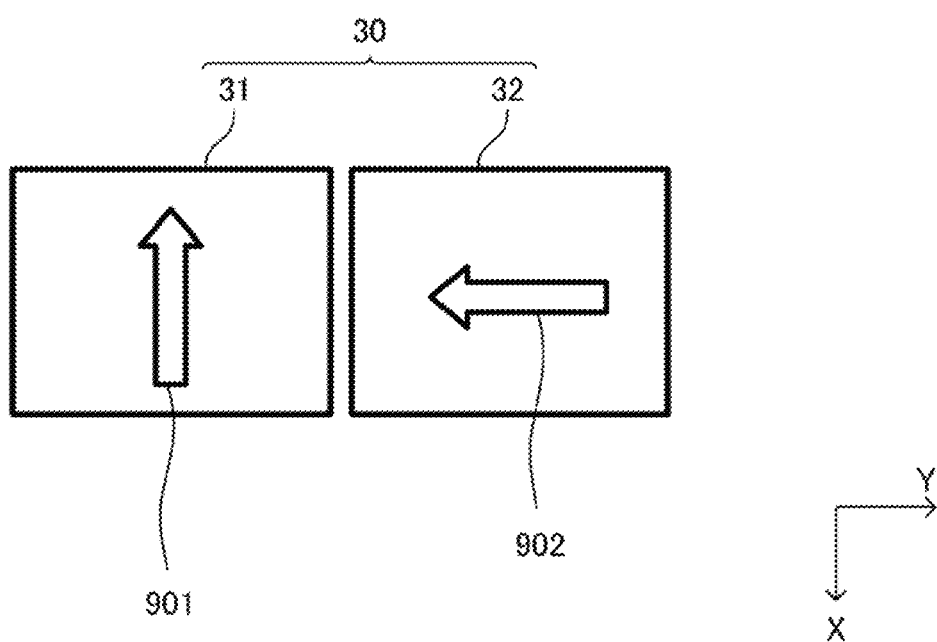

FIG. 4(A) is a schematic cross-sectional view in a Y-Z plane of the press sensors 11 and 12. FIG. 4(B) is a schematic plan view in an X-Y plane for describing a piezoelectric film 30 according to the first embodiment. In FIG. 4(B), illustration of parts other than the piezoelectric film 30 of the press sensor 11 will be omitted.

As shown in FIG. 4(A), the press sensor 11 includes a first piezoelectric film 31 having a flat film shape, a first electrode 13, and a ground electrode 15. The press sensor 12 includes a second piezoelectric film 32 having a flat film shape, a second electrode 14, and the ground electrode 15 common to the press sensor 11. The first and second piezoelectric films 31 and 32 are disposed so as to be adjacent to each other in a Y direction on the ground electrode 15. The first electrode 13 is disposed on the first piezoelectric film 31, and the second electrode 14 is disposed on the second piezoelectric film 32. The first electrode 13 is disposed on a first main surface of the first piezoelectric film 31, and the second electrode 14 is disposed on a first main surface of the second piezoelectric film 32. Further, the ground electrode 15 is disposed on a second main surface of the first piezoelectric film 31 and the second piezoelectric film 32. That is, the first piezoelectric film 31 is disposed in the first region R1, and the second piezoelectric film 32 is disposed in the second region R2.

As shown in FIG. 4(B), the first and second piezoelectric films 31 and 32 are preferably formed in a rectangular shape. However, they are not so limited and other shapes can be used.

The first and second piezoelectric films 31 and 32 are preferably made from a film formed of a chiral polymer. As the chiral polymer, polylactic acid (PLA), particularly poly-L-lactic acid (PLLA), is used in the first embodiment. In PLLA formed from a chiral polymer, a main chain has a helical structure. PLLA has piezoelectricity when uniaxially stretched and a molecule is oriented. Then, the uniaxially stretched PLLA generates a largest potential when deformed in a direction forming an angle of 45° with respect to the uniaxially stretched direction. That is, the first piezoelectric film 31 and the second piezoelectric film 32 generate electric charges due to shear distortion.

The uniaxial stretching direction of the first piezoelectric film 31 (PLLA) is preferably parallel to an X direction as indicated by an arrow 901 in FIG. 4(B). The uniaxial stretching direction of the second piezoelectric film 32 (PLLA) is preferably parallel to the Y direction as indicated by an arrow 902. That is, the uniaxial stretching direction of the first piezoelectric film 31 is orthogonal to the uniaxial stretching direction of the second piezoelectric film 32. Here, "parallel" refers to a direction that forms an angle of 0 degrees±10 degrees with the X direction or the Y direction.

Potential generated by deformation in which the first piezoelectric film 31 is stretched in a direction inclined by 45° clockwise with respect to the X direction, and potential generated by the same deformation of the second piezoelectric film 32 as the first piezoelectric film 31 have opposite polarity. That is, a signal generated by deformation of the first region R1 having the first piezoelectric film 31 has polarity opposite to that of a signal generated by the same deformation of the second region R2 having the second piezoelectric film 32. Here, in a case where the second piezoelectric film 32 is deformed so as to be stretched in a direction inclined by 45° counterclockwise, potential generated by the second piezoelectric film 32 has the same polarity as that generated by the first piezoelectric film 31. That is, in a case where the second piezoelectric film 32 is stretched in a direction inclined by 90° with respect to a direction in which the first piezoelectric film 31 is stretched, the potentials generated by the first and second piezoelectric films 31 and 32 have the same polarity.

For the first electrode 13, the second electrode 14, and the ground electrode 15, an electrode based on metal, such as aluminum or copper, is preferably used. By providing the first electrode 13, the second electrode 14, and the ground electrode 15 described above, charges generated by the first piezoelectric film 31 and the second piezoelectric film 32 can be acquired as a potential difference, and a detection signal of a voltage value corresponding to a deformation amount can be output to the outside.

Figure 5:
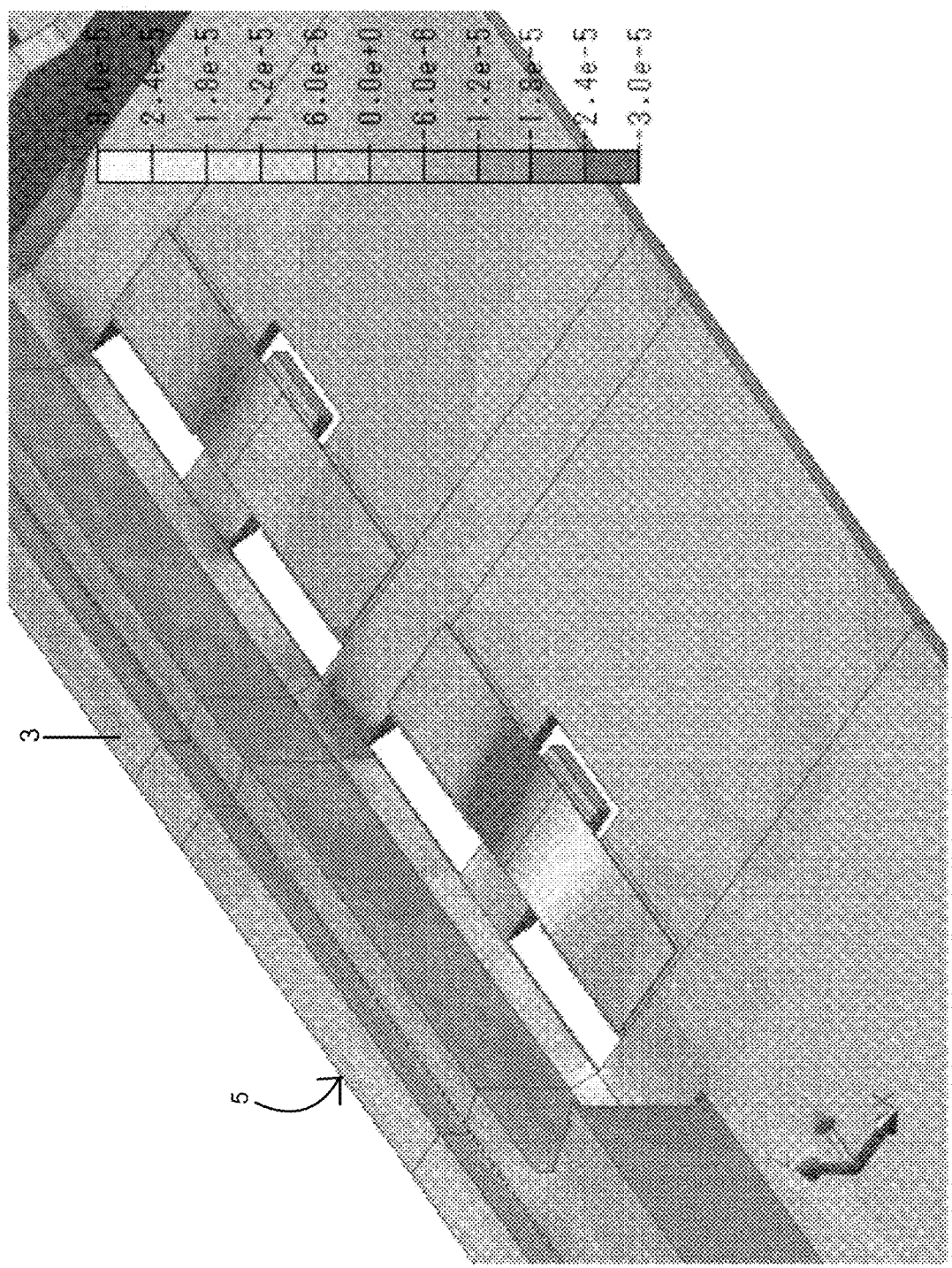
FIG. 5 is a diagram showing a simulation result of deformation of a housing and each press sensor when a side wall of the housing according to the first embodiment receives pressing operation.
Figure 10:
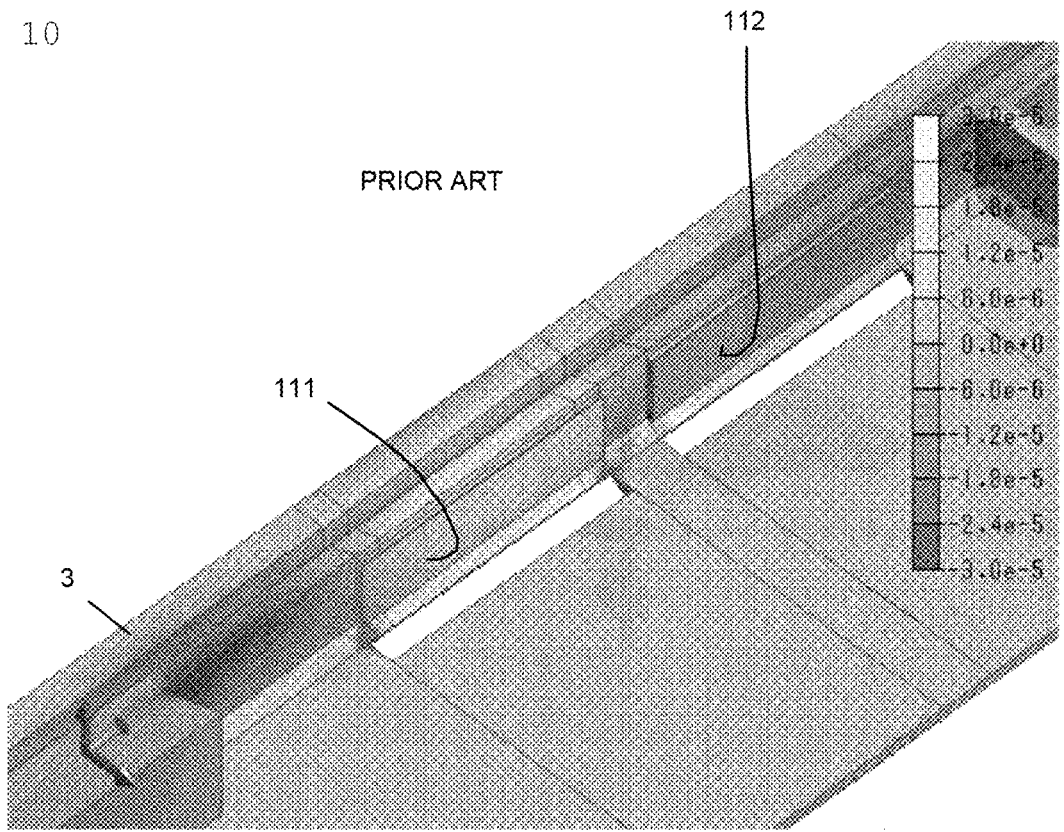
FIG. 10 is a diagram showing a simulation result of deformation of a housing and each press sensor when a side wall of the housing receives pressing operation in the arrangement structure of the press sensor according to the conventional art.

FIG. 5 is a diagram showing a simulation result of deformation of the housing 2, the press sensor 11, and the press sensor 12 when the button region 5 on the side wall 3 of the housing 2 receives pressing operation. FIG. 10 is a diagram showing a simulation result of deformation of the housing 2 and each of the press sensors when the side wall 3 of the housing 2 receives pressing operation in the arrangement structure of the press sensor according to the conventional art. The housing 2 in the arrangement structure of the press sensor according to the conventional art has a substantially similar configuration to the housing 2 of the present embodiment except that the slit 20 is not formed. That is, the side wall 3 of the housing 2 is formed to be thin. FIGS. 5 and 10 show the magnitude of deformation at each position of the housing 2 by color (shade) gradation.

Figure 9:
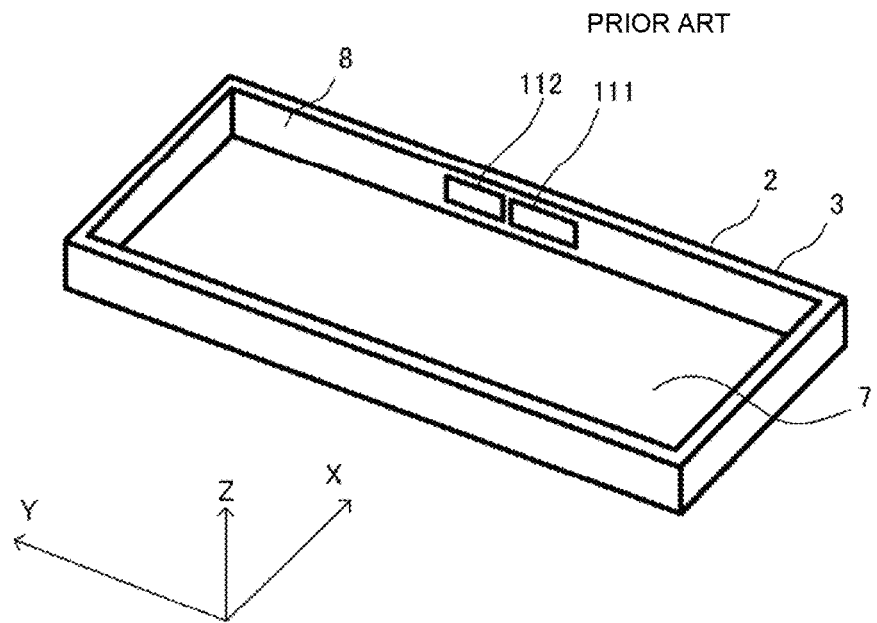
FIG. 9 is a diagram for describing an arrangement structure of a press sensor according to the conventional art.

First, with reference to FIG. 10, A simulation result of deformation (due to a pressing operation) of the side wall 3 of the housing 2 of the conventional structure shown in FIG. 10, and its effects on press sensors 111 and 112, will be described first. The press sensors 111 and 112 are disposed on the side wall 3 of the housing 2 as shown in FIG. 9. When the side wall 3 of the housing 2 receives pressing operation in the conventional structure, the area where the press sensors 111 and 112 can be disposed is small. As a result, the size of the press sensors and the deformation of the press sensors is reduced. As the thickness of the side wall 3 of the housing 2 is reduced, an output from the press sensor 111 and the press sensor 112 may be reduced.

The present embodiment overcomes this problem by locating the press sensors 11 and 12 on the bottom wall 7 of the housing 2. With this arrangement, even if the side wall 3 of the housing 2 is thin, the size of the press sensors 11 and 12 does not need to be small and the sensitivity of the press sensors 11 and 12 can be improved.

As shown in FIG. 5, when the button region 5 of the housing 2 receives pressing operation, shear distortion occurs between the first and second regions R1 and R2 of the bottom wall 7 and, with it, respective portions of the press sensor 11. At the same time, shear distortion occurs between the first and third regions R1 and R3 of the bottom wall 7 and, with it, respective portions of the press sensor 12. The direction of the shear distortion that occurs in the press sensor 11 and the shear distortion that occurs in the press sensor 12 are different by 90°. The amount of expansion and contraction of the housing 2 when the button region 5 of the housing 2 receives pressing operation is extremely small. However, the shear distortion that occurs between the first region R1 and the second region R2 and between the first region R1 and the third region R3 is large. Further, polylactic acid has a characteristic of having high sensitivity to shear distortion. Therefore, the press sensor 11 and the press sensor 12 can detect shear distortion with very high sensitivity. Hereinafter, deformation of the bottom wall 7, the press sensor 11, and the press sensor 12 when the button region 5 of the housing 2 receives pressing operation will be described with reference to FIG. 3.

When the button region 5 receives a pressing operation, the force applied to the button region 5 by the pressing operation is transmitted from the side wall 3 (where the button region 5 is located) to the bottom wall 7. Because of the presence of the slit 20, the first region R1 is displaced in a direction away from the side wall 3 of the housing 2 by a greater degree than the second or third regions R2 or R3.

Figure 3:
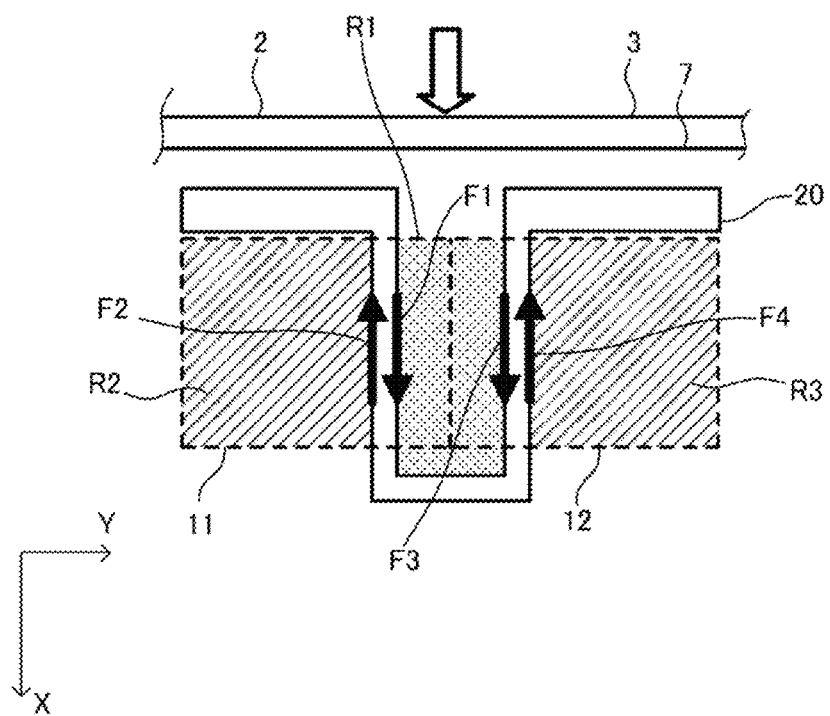
FIG. 3 is a diagram for describing displacement of the press sensor according to the first embodiment.

As shown in FIG. 3, when a pressing operation of the button region 5 is performed, opposed sheer forces will be applied to press sensors 11 and 12. More particularly, a force F1, in a direction away from the wall 3 of the housing 2, is applied to the portion of the first region R1 facing the second region R2 and a force F2, in a direction toward from the wall 3 of the housing 2, is applied to the portion of the second region R2 facing the first region R1. As a result, shear distortion occurs in the press sensor 11.

Similarly, a force F3, in a direction away from the wall 3 of the housing 2, is applied to the portion of the first region R1 facing the third region R3 and a force F4, in a direction toward from the wall 3 of the housing 2, is applied to the portion of the third region R3 facing the first region R1. As a result, shear distortion occurs in the press sensor 12. As a result of these distortions, the press sensors 11 and 12 can detect a signal generated by shear distortion.

At this time, in the first piezoelectric film 31 of the press sensor 11, shear deformation symmetrical to that of the second piezoelectric film 32 of the press sensor 12 with respect to the first region R1 occurs. That is, directions of shear distortion that occurs in the first piezoelectric film 31 and shear distortion that occurs in the second piezoelectric film 32 are opposite to each other. Here, the uniaxial stretching direction of the first piezoelectric film 31 is orthogonal to the uniaxial stretching direction of the second piezoelectric film 32. For this reason, potentials generated by the first piezoelectric film 31 and the second piezoelectric film 32 have the same polarity. Therefore, a larger potential can be obtained by adding the potentials generated by the first piezoelectric film 31 and the second piezoelectric film 32.

Note that, in the preferred embodiment, PLLA is used for the first piezoelectric film 31 and the second piezoelectric film 32; however, the second piezoelectric film 32 may be PDLA. In this case, the uniaxial stretching direction of the second piezoelectric film 32 is parallel to the Y direction like the first piezoelectric film 31.

Note that, in the preferred embodiment, separate first and second piezoelectric films 31 and 32 are used. However, the configuration may be such that only the first piezoelectric film 31 is used. In this case, the first electrode 13 is disposed on a main surface on the opposite side of the first piezoelectric film 31 with respect to the second electrode 14. Alternatively, the configuration may be such that one of obtained potentials is added after positive and negative are inverted. Other than the above, any configuration may be employed as long as potentials detected by the first piezoelectric film 31 and the second piezoelectric film 32 are added without being canceled out.

Note that, in the preferred embodiment, the housing 2 has a rectangular parallelepiped shape; however, the shape of the housing 2 is not so limited. Examples of the shape of the housing 2 include other shapes such as a column, a polygonal column, a sphere, and a polygonal pyramid. Further, the housing 2 may be one that has a rectangular parallelepiped shape with chamfered corners.

The electronic device 1 of the present embodiment can be a communication device as shown in FIG. 1(A). However, the invention is not so limited and can be used, for example, in operation devices such as a controller or a remote controller.

Figure 6:
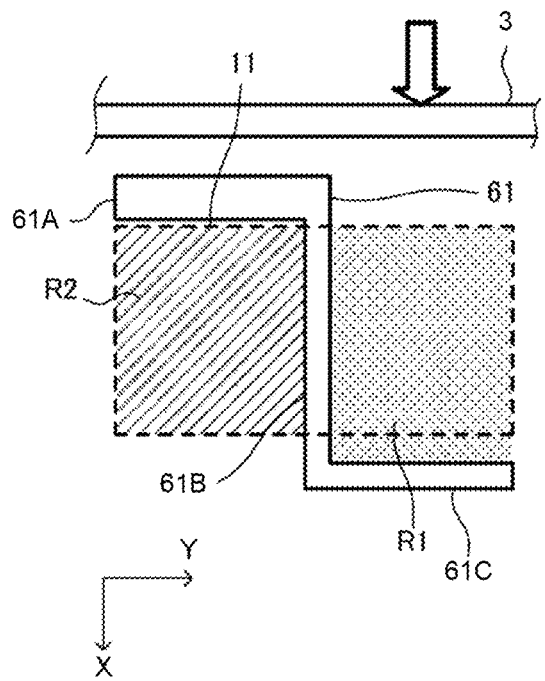
FIGS. 6(A) to 6(C) are diagrams for describing a variation of the arrangement structure of the press sensor according to the first embodiment.
Figure 6:
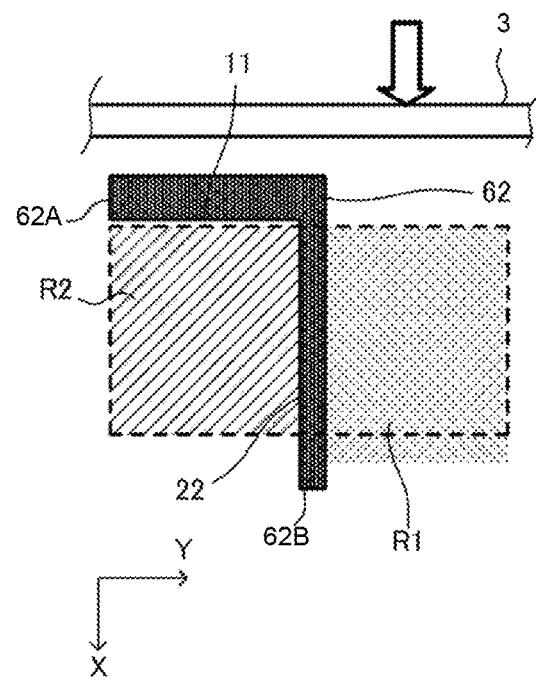
Figure 6:
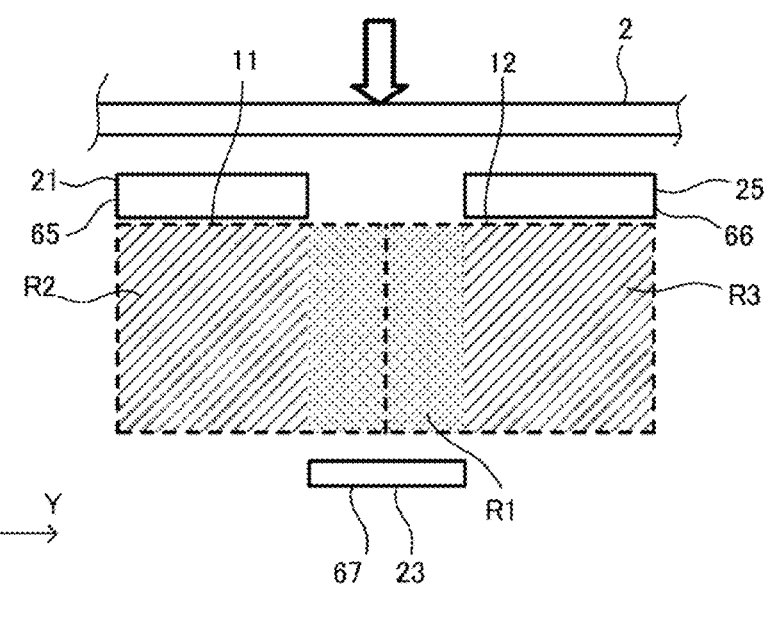

FIGS. 6(A) to 6(C) are diagrams for describing first to third variations of the arrangement structure of the press sensor according to the first embodiment. FIGS. 6(A) to 6(C) are plan views in the X-Y direction, and show only the periphery of the press sensor. Note that, for the first to third variations, only a portion different from the arrangement structure of the press sensors according to the first embodiment will be described, and the rest will be omitted.

In the variation of FIG. 6(A) only a single press sensor 11 is used. A slit 61 is formed on the bottom wall 7 and includes a first segment 61A, a second segment 61B and a third segment 61C. The segment 61B divides the bottom wall into first and second regions R1 and R2. The use of this slit makes its formation easier than that slit 20 of the first embodiment.

In this variation, only the potential generated from the press sensor 11 is detected. For this reason, this variation does not need to include a configuration for adding potential. Further, since only the press sensor 11 is used, a simple sensor arrangement can be obtained. In this embodiment the first press sensor 11 is used. Alternatively, the second press sensor 12 can be use in leiu of the first press sensor 11. Note that, in this variation, either one of the press sensor 11 and the press sensor 12 only needs to be disposed. In such a case, the press sensor 12 is disposed, for example, so as to extend across the first and third regions R1 and R3 shown in FIG. 2(B). A similar effect can be obtained also in the above manner.

FIG. 6(B) shows the second variation. In this variation, a slit 62 is formed on the bottom wall 7. However, this slit only has segments 62A and 62B make its shape simpler and easier to form. Further, the slit 62 is preferably filled with a filler 64. The filler 64 is made from a material that is softer than the material of the housing 2. Since the slit 62 is filled with the filler 64, a failure or malfunction due to dust or the like entering the slit 62 can be prevented.

FIG. 6(C) shows a third variation wherein three separate slits 65, 66 and 67 are formed on the bottom wall 7. The slit 65 is formed between the side wall 3 and the second region R2, the slit 66 is formed between the side wall 3 and the third region R3 and the third slit 67 is formed on the side of the press sensors 11 and 12 located away from the side wall 3. The slits 65, 66, and 67 have a simple shape and can be easily formed.

Figure 7:
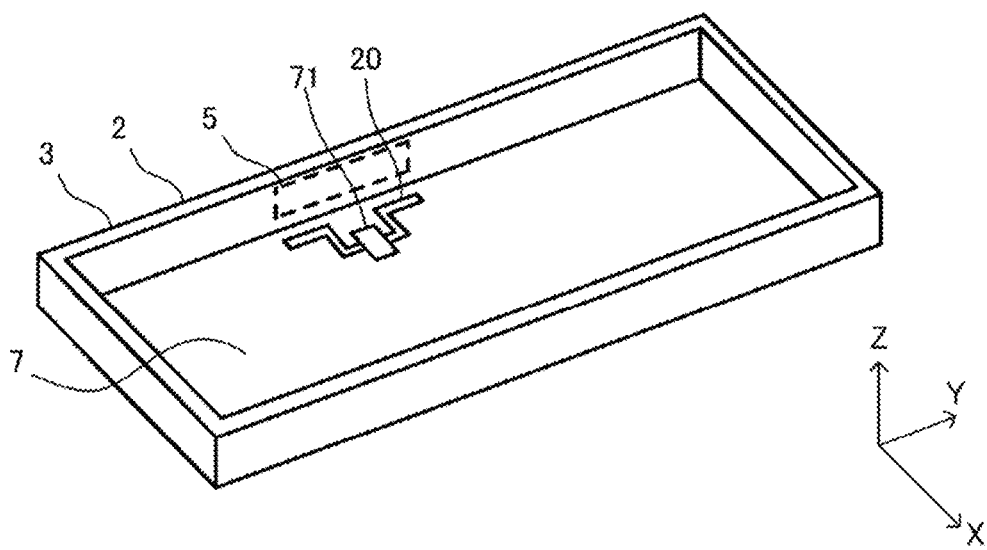
FIG. 7(A) is a diagram for describing the arrangement structure of the press sensor according to a second embodiment.
FIG. 7(B) is a partially enlarged plan view of FIG. 7(A).
Figure 7:
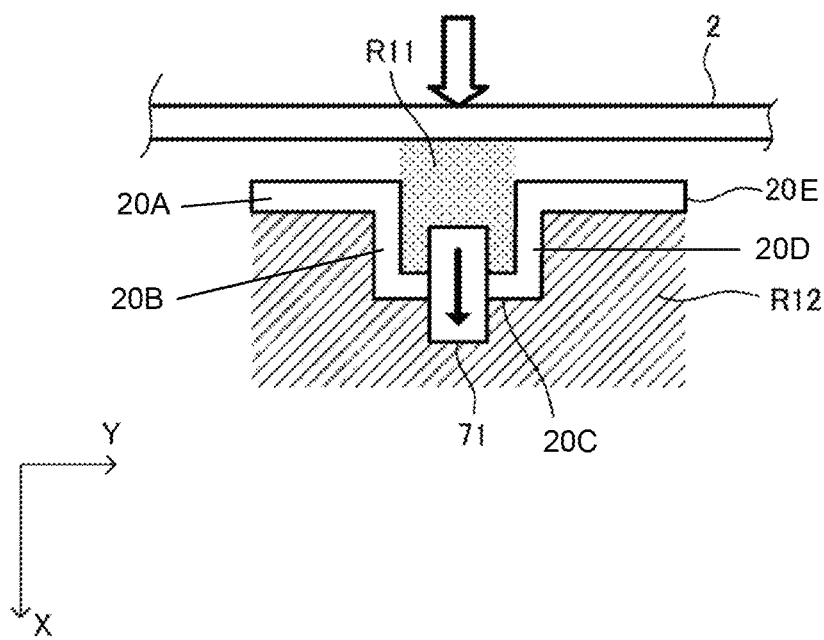

FIG. 7(A) is a diagram for describing the arrangement structure of the press sensor according to a second embodiment of the invention. FIG. 7(B) is a partially enlarged plan view of FIG. 7(A). The second embodiment is, in significant part, different from the first embodiment in that a strain gauge 71 is used instead of the press sensor 11 or the press sensor 12.

As shown in FIGS. 7(A) and 7(B), the bottom wall 7 has first and second regions R11 and R12. The first region R11 is located closer to the side wall 3 than the slit 20. The second region R12 is on the opposite of the slit 20. When a pressing operation is applied to the button region 5, deformation due to the pressing operation is directly transmitted to the first region R11. On the other hand, the slit 20 is formed between the side wall 3 and the second region R12. However, transmission of the deformation to the second region R12 is suppressed by the presence of the slit 20. Like the prior embodiment, the first region R11 is much more easily displaced (in response to the pressing operation) than the second region R12.

The strain gauge 71 is disposed so as to extend across the segment 20C of the slit 20 from the first region R11 to the second region R12. The strain gauge 71 overlaps a portion of the first and second regions R11 and R12 as shown. The strain gauge 71 is adhered to the bottom wall 7. In the preferred embodiment, the strain gauge 71 is elongated along its elongated axis extends parallel to the X direction. Note that although the strain gauge 71 is disposed so as to extend across the segment 20C, the configuration is not so limited.

When the button region 5 receives pressing operation, the first region R11 (that is relatively easily displaced) is displaced to a greater degree than the second region R12 in a direction away from the side wall 3 of the housing 2. However, a force due to the pressing operation is hardly transmitted to the second region R12 which is separated from the side wall 3 by the slit 20. Therefore, displacement in a direction away from the side wall 3 of the housing 2 of the second region R12 is smaller than that of the first region R11. In this manner, a distance between the first region R11 and the second region R12 is shortened.

When the strain gauge 71 is expanded and contracted in an arrow direction (X direction) shown by the strain gauge 71 in FIG. 7(B), resistance changes according to the degree of expansion and contraction of the strain gauge 71. When the button region 5 receives pressing operation, the strain gauge 71 contracts in the X direction. Therefore, the strain gauge 71 can detect that the button region 5 has received pressing operation.

Note that, in the present embodiment, the slit 20 has a U-shape including segments 20A-20E. However, the shape of the slit is not so limited. For example, the slit 20 may be a straight line parallel to the Y direction, or may have a shape in which a portion protruding to the side away from the side wall 3 is curved.

FIGS. 8(A) to 8(F) are diagrams for describing fourth to ninth variations of the arrangement structure of the press sensor according to the second embodiment. FIGS. 8(A) to 8(F) are plan views in the X-Y direction, and show only the periphery of the press sensor. Note that, for the fourth to ninth variations, only a portion which is different from the arrangement structure of the press sensors according to the second embodiment will be described, and the rest will be omitted. The strain gauges 72 to 75 are similar to the strain gauge 71.

Figure 8:
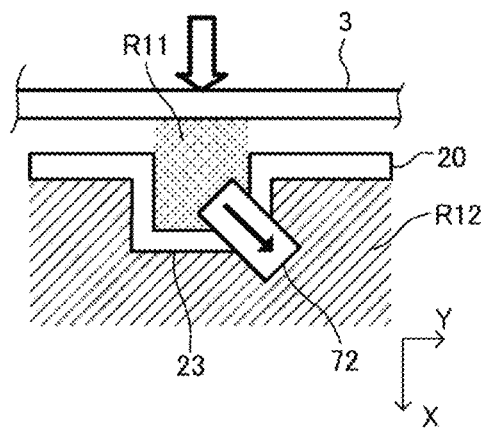
FIGS. 8(A) to 8(F) are diagrams for describing a variation of the arrangement structure of the press sensor according to the second embodiment.
Figure 8:
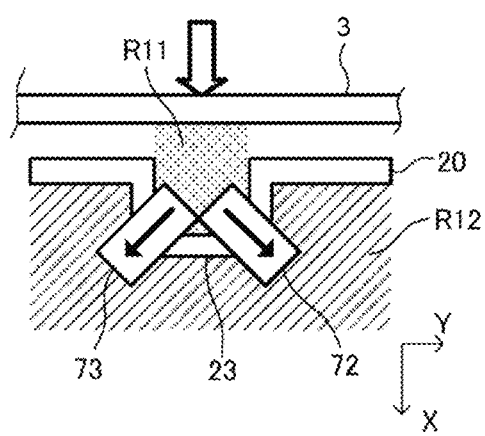
Figure 8:
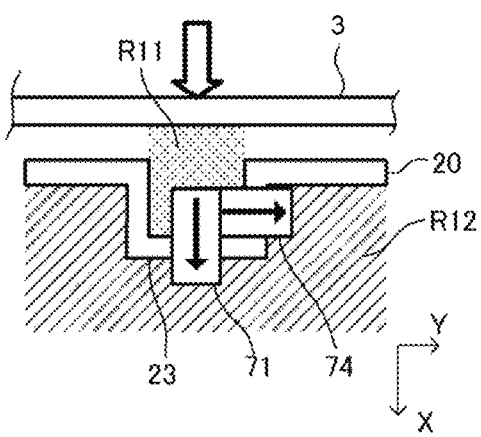
Figure 8:
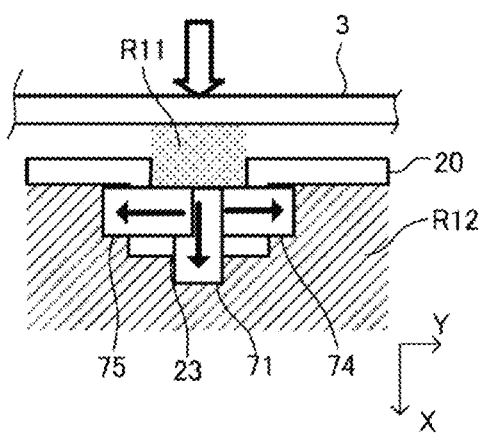
Figure 8:
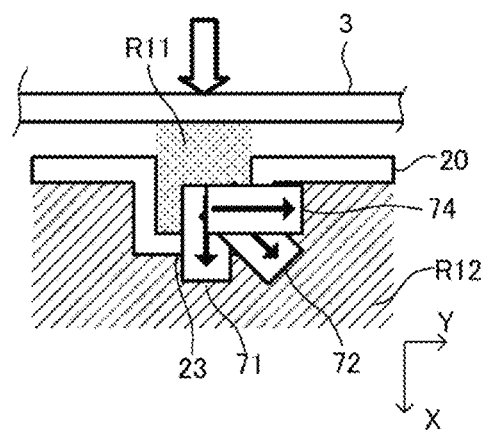
Figure 8:
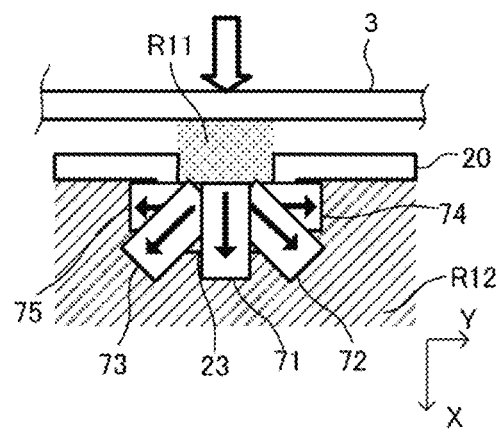

FIG. 8(A) shows the fourth variation. In the fourth variation, the strain gauge 72 is adhered to the bottom wall 7 along a direction inclined by 45° counterclockwise with respect to the X direction. In this manner, in a case where the button region 5 receives a pressing operation, the strain gauge 72 can detect contraction in the direction inclined by 45° counterclockwise with respect to the X direction.

FIG. 8(B) shows the fifth variation. The fifth variation is obtained by further adding a second strain gauge 73 to the fourth variation. The strain gauge 73 is adhered to the bottom wall 7 along a direction inclined by 45° clockwise with respect to the X direction. In this manner, in a case where the button region 5 receives pressing operation, the strain gauge 72 can detect contraction in the direction inclined by 45° counterclockwise with respect to the X direction, and the strain gauge 73 can detect contraction in the direction inclined by 45° clockwise with respect to the X direction.

FIG. 8(C) shows the sixth variation. The sixth variation is obtained by further adding a strain gauge 74 to the second embodiment. The strain gauge 74 is disposed so as to extend across the slit 20 along a direction parallel to the Y direction. In this manner, in a case where the button region 5 receives pressing operation, the strain gauge 71 can detect contraction in the direction parallel to the X direction, and the strain gauge 73 can detect contraction in the direction parallel to the Y direction.

FIG. 8(D) shows the seventh variation. The seventh variation is obtained by further adding a strain gauge 75 to the sixth variation. The strain gauge 75 is disposed so as to extend across the slit 20 along a direction parallel to the Y direction like the strain gauge 74. The strain gauge 75 is adhered to the bottom wall 7 symmetrically to the strain gauge 74 with respect to the first region R11. In this manner, in a case where the button region 5 receives pressing operation, the strain gauge 75 can detect contraction in the direction parallel to the Y direction, in addition to the strain gauge 71 and the strain gauge 74.

FIG. 8(E) shows the eighth variation. The eighth variation is obtained by further adding the strain gauge 72 to the sixth variation. In this manner, in a case where the button region 5 receives pressing operation, the strain gauge 72 can detect contraction in the direction inclined by 45° counterclockwise with respect to the X direction, in addition to the strain gauge 71 and the strain gauge 74.

FIG. 8(F) shows the ninth variation. The ninth variation is obtained by further adding the strain gauge 72 and the strain gauge 73 to the seventh variation. In this manner, in a case where the button region 5 receives pressing operation, the strain gauge 72 can detect contraction in the direction inclined by 45° counterclockwise with respect to the X direction, and the strain gauge 73 can detect contraction in the direction inclined by 45° clockwise with respect to the X direction, in addition to the strain gauge 71, the strain gauge 74, and the strain gauge 75.

Finally, the description of the present embodiments is to be considered in all respects as illustrative and not restrictive. The scope of the present invention is indicated not by the above-described embodiments but by the claims. Furthermore, the scope of the present invention is intended to include all variations within the meaning and scope equivalent to the scope of the claims.

DESCRIPTION OF REFERENCE SYMBOLS

1: Electronic device
2: Housing

3: Side wall
7: Bottom wall
8: Cavity
11, 12: Press sensor
13: First electrode
14: Second electrode
15: Ground electrode
20, 65, 66, 67: Slit
30: Piezoelectric film
31: First piezoelectric film
32: Second piezoelectric film
64: Filler
71, 72, 73, 74, 75: Strain gauge
R1, R11: First region
R2, R12: Second region
R3: Third region

The invention claimed is:

1. A combination comprising:
  (a) a housing having a recess defined by a bottom wall and at least one side wall extending upwardly from the bottom wall
    the bottom wall having first and second regions, the first region being more easily displaced in response to a pressing operation applied to the side wall than the second region; and
  (b) a press sensor disposed on the bottom wall and extending across portions of the first and second regions, the press sensor being spaced from the side wall with an air gap therebetween.

2. The combination according to claim 1, wherein a slit is located in the bottom wall between the side wall and the second region and causes the first region to be more easily displaced in response to the pressing operation than the second region.

3. The combination according to claim 2, wherein the slit is located between the first and second regions and divides the bottom wall into the first and second regions.

4. The combination according to claim 3, wherein the slit includes first and second segments located on opposite sides of the press sensor, the first segment being located between the press sensor and the side wall.

5. The combination according to claim 2, wherein the bottom wall also includes a third region, the first region being sandwiched by the second and third regions, the first region being more easily displaced in response to the pressing operation than the third region.

6. The combination according to claim 5, wherein a slit is also located between the side wall and the third region.

7. The combination according to claim 5, wherein the combination further includes a second press sensor disposed on the bottom wall so as to extend across the first and third regions.

8. The combination according to claim 2, further comprising a filler which fills the slit, the filler being made of a material that is softer than a portion of the housing that is located between the side wall and the second region.

9. The combination according to claim 2, wherein the slit has a first segment located between the side wall and the second region, and a second segment located between the first and second regions, and the combination further comprising a filler which fills the slit, the filler being made of a material that is softer than a portion of the housing that is located between the side wall and the second region.

10. The combination according to claim 5, wherein the slit has a first, second, third, fourth and fifth segments, the first segment being located between the side wall and the second region, the second segment extending from the first segment and across the first press sensor to define a boundary point between the first and second regions, the fourth segment extending across the second press sensor to define a boundary point between the first and third regions, the fifth segment extending from the fourth segment and between the side wall and the second press sensor, and the third segment connecting the second and fourth segments.

11. The combination according to claim 1, wherein the press sensor includes a piezoelectric film that detects shear distortion.

12. The combination according to claim 11, wherein the piezoelectric film contains polylactic acid.

13. The combination according to claim 12, wherein the piezoelectric film contains the polylactic acid stretched in a direction parallel to or orthogonal to a boundary line between the side wall and the bottom wall.

14. The combination according to claim 5, wherein the slit:
  defines a first the boundary line between the first and second regions, the second boundary line dividing the first press sensor into first and second parts; and
  defines a second boundary line between the first and third regions, the second boundary line dividing the second press sensor into first and second parts.

15. The combination according to claim 14, wherein the slit causes sheer distortion to occur in the first and second press sensors in response to the pressing operation.

16. The combination according to claim 1, wherein:
  the bottom wall also includes a third region, the first region being sandwiched by the second and third regions, the first region being more easily displaced in response to the pressing operation than the third region;
  the press sensor extends over at least a portion of the each of the first, second and third regions; and
  first and second slits are located in the bottom wall between the side wall and the second and third regions, respectively, the first and second slits causing the first region to be more easily displaced in response to the pressing operation than the second and third regions.

17. The combination according to claim 16, further including a third slit located on the opposite side of the press sensor relative to the first and second slits and being located in an area corresponding to the first region.

18. The combination according to claim 1, wherein the press sensor is a strain gauge.

19. The combination according to claim 18, wherein a slit is located in the bottom wall between the side wall and the second region and causes the first region to be more easily displaced in response to the pressing operation than the second region.

20. An electronic device comprising the combination of claim 1.

* * * * *